US011789819B1

(12) United States Patent
Simionescu et al.

(10) Patent No.: US 11,789,819 B1
(45) Date of Patent: Oct. 17, 2023

(54) SEAMLESS RECOVERY OF A HARDWARE-BASED I/O PATH IN A MULTI-FUNCTION NVME SSD

(71) Applicant: Micron Technology, Inc., Boise, ID (US)

(72) Inventors: Horia C. Simionescu, Foster City, CA (US); Ramkumar Venkatachalam, Bengaluru (IN); Anirban Kundu, Bengaluru (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/733,519

(22) Filed: Apr. 29, 2022

(51) Int. Cl.
*G06F 11/14* (2006.01)
*G11C 29/08* (2006.01)

(52) U.S. Cl.
CPC .......... *G06F 11/1415* (2013.01); *G11C 29/08* (2013.01); *G06F 2201/82* (2013.01)

(58) Field of Classification Search
CPC .. G06F 11/1415; G06F 2201/82; G11C 29/08
See application file for complete search history.

(56) References Cited

U.S. PATENT DOCUMENTS

| | | | |
|---|---|---|---|
| 6,393,590 B1 * | 5/2002 | Wood | G06F 11/0757 714/10 |
| 7,762,818 B2 | 7/2010 | Hoang | |
| 8,429,436 B2 * | 4/2013 | Fillingim | G06F 11/3034 713/320 |
| 9,477,295 B2 | 10/2016 | Jreji et al. | |
| 10,372,354 B1 * | 8/2019 | Parvathareddy | G06F 3/0689 |
| 10,796,762 B2 | 10/2020 | Peddle et al. | |
| 11,656,794 B2 * | 5/2023 | Grosz | G06F 3/0611 711/167 |
| 2010/0157683 A1 * | 6/2010 | Nguyen | G11C 16/10 365/185.18 |
| 2012/0192178 A1 * | 7/2012 | Brownlow | G06F 9/45558 718/1 |
| 2014/0281695 A1 * | 9/2014 | Kraipak | G06F 11/0766 714/10 |
| 2016/0124682 A1 | 5/2016 | Koizumi | |
| 2018/0165118 A1 * | 6/2018 | Bar | G06F 9/4825 |
| 2018/0189208 A1 * | 7/2018 | Modan | G06F 9/4825 |
| 2018/0210661 A1 * | 7/2018 | Hyun | G06F 3/067 |
| 2022/0004466 A1 * | 1/2022 | Richter | G11C 29/022 |
| 2022/0100607 A1 * | 3/2022 | Behl | G06F 11/1474 |

* cited by examiner

*Primary Examiner* — Loan L. T. Truong
*Assistant Examiner* — Indranil Chowdhury
(74) *Attorney, Agent, or Firm* — Brooks, Cameron & Huebsch, PLLC

(57) ABSTRACT

A method includes receiving signaling indicative of performance of a reset operation involving a first physical function associated with a controller of a memory device and initiating a first timer that corresponds to an amount of time available for the first physical function associated with the controller of the memory device to complete execution of pending commands. The method further includes initiating a second timer that corresponds to an amount of time available for a second physical function associated with the controller of the memory device to complete execution of pending commands and initiating a third timer that corresponds to an amount of time available for the second physical function associated with the controller of the memory device to join a recovery operation that is instigated as a result of performance of the reset operation.

23 Claims, 6 Drawing Sheets

US 11,789,819 B1

SEAMLESS RECOVERY OF A HARDWARE-BASED I/O PATH IN A MULTI-FUNCTION NVME SSD

TECHNICAL FIELD

Embodiments of the disclosure relate generally to memory sub-systems, and more specifically, relate to seamless recovery of a hardware-based I/O path in a multi-function NVMe SSD.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3-1 and FIG. 3-2 illustrate an example of a hardware-based input/output path for a multi-function NVme device in accordance with some embodiments of the present disclosure.

DETAILED DESCRIPTION

Figure 1:
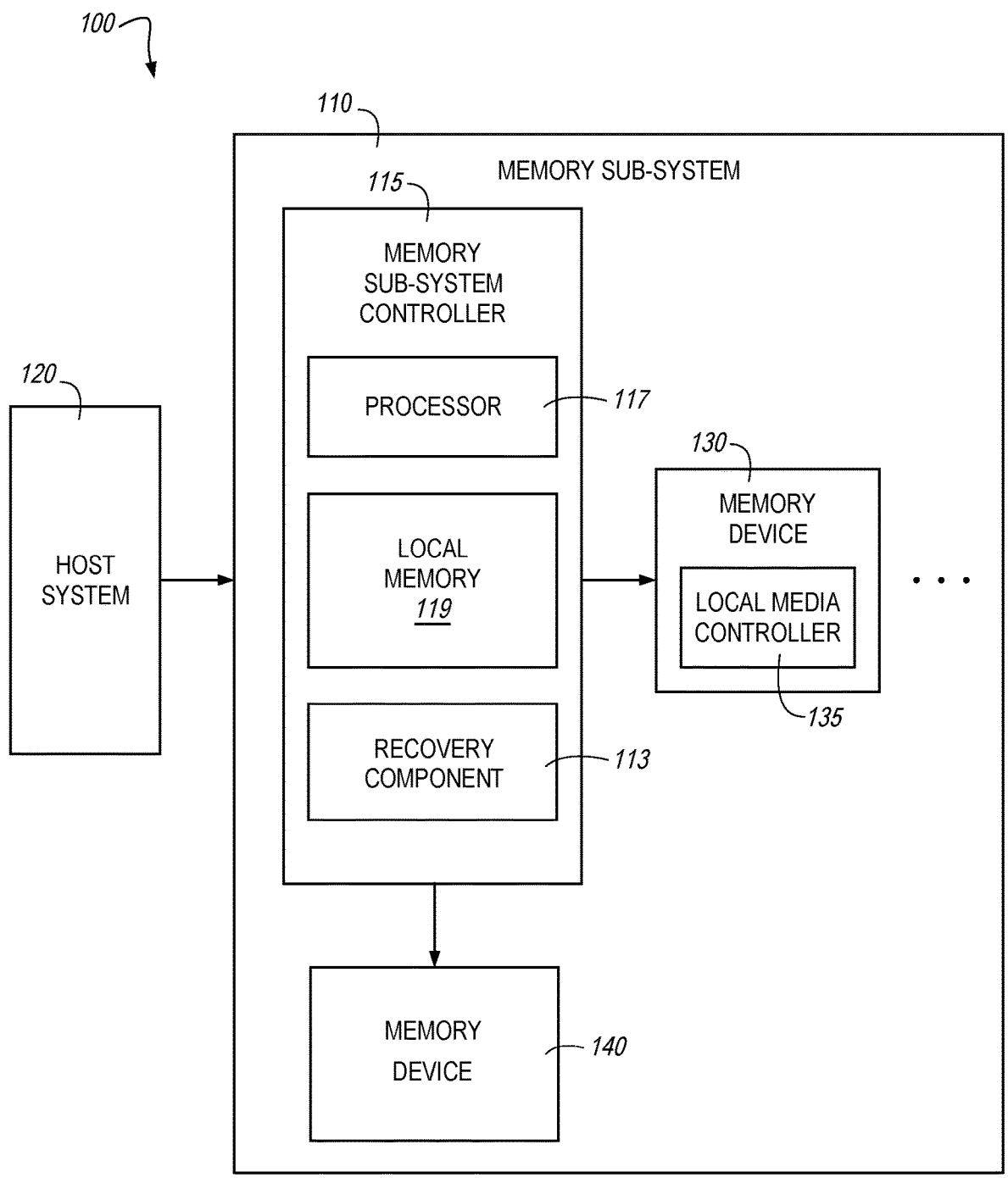
FIG. 1 illustrates an example computing system that includes a memory sub-system in accordance with some embodiments of the present disclosure.

Aspects of the present disclosure are directed to seamless recovery of a hardware-based I/O path in a memory sub-system and, more particular to seamless recovery of a hardware-based I/O path in a multi-function NVMe SSD. A memory sub-system can be a storage system, storage device, a memory module, or a combination of such. An example of a memory sub-system is a storage system such as a solid-state drive (SSD) and, more particularly, a multi-function non-volatile memory express (NVMe) SSD. Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A storage system, such as a SSD, can include multiple interface connections to one or more host systems (hereinafter referred to as hosts). The interface connections can be referred to as ports. A host can send data commands (e.g., read, write, erase, program, etc.) to the SSD via a port. The ports can be physical and/or virtual ports (which may be referred to as physical functions and virtual functions, respectively). For example, a physical port may include a physical connection (e.g., a physical path such as a peripheral component interconnect express (PCIe) path, non-volatile memory express (NVMe) path, etc.) and a virtual port may include a virtual connection (e.g., a logical path such as a PCIe virtual function). Such connections or "paths" may be referred to herein in the alternative as "interfaces" or "buses."

An example SSD can be a NVMe SSD that includes multi-controller devices with each controller being coupled to a PCIe function. Such categories of NVMe SSDs can be referred to generally as "multi-function NVMe devices." Multi-function NVMe devices can be utilized in datacenter applications in which a user can create a virtual machine (VM) and directly attach the VM to a PCIe function. By allowing for the PCIe function to be directly attached to the VM, software overhead associated with approaches that utilize one or more software layers to manage VMs can be mitigated or eliminated.

However, NVMe SSDs (as well as other types of SSDs) can experience failures (e.g., hardware failures) that can result in the NVMe SSD requiring a reset. For example, in approaches in which an input/output (I/O) path of the NVMe SSD is implemented in hardware and a failure occurs in the hardware I/O path that is coupled to multiple physical functions (PFs), an I/O timeout condition can occur. The I/O timeout condition can lead to one or more of the PFs encountering NVMe controller resets and/or PCIe function level resets (FLRs) from a host coupled to the NVMe SSD.

In conventional approaches, firmware associated with the NVMe SSD attempts to capture a state of the hardware when it is determined that an error or failure has occurred. For example, in some approaches, the firmware attempts to collect information (e.g., state information) from registers associated with the NVMe SSD (e.g., registers of the frontend circuitry, the backend circuitry, the NVMe circuitry, and/or the PCIe circuitry, among others, if necessary). The firmware is then generally configured to refrain from attempting to perform any recovery operations; instead, the host can issue a reset to all the NVMe PFs that have experienced the timeout condition.

The host generally then drops the NVMe PFs that have experienced the timeout condition from a list of managed NVMe devices (e.g., a list of NVMe devices managed by the host). In order to recover from this condition and allow the host to repopulate the list of managed NVMe devices with the NVMe PFs that experienced the timeout condition, user intervention is generally required to physically power cycle the host and/or the NVMe SSD. In such approaches, user intervention is also generally required to retrieve the information collected from the registers by the firmware for later analysis to determine the cause of the initial error or failure.

Aspects of the present disclosure address the above and other deficiencies by allowing for seamless recovery of a hardware-based I/O path in a multi-function NVMe SSD. For example, embodiments of the present disclosure allow for transactions involving PFs to be continuously fulfilled across hardware-based I/O of the multi-function NVMe SSD even after encountering an error or failure in the hardware I/O path. In addition, aspects of the present disclosure allow for collection of information (e.g., state information) from registers associated with the NVMe SSD (e.g., registers of the frontend circuitry, the backend circuitry, the NVMe circuitry, and/or the PCIe circuitry, among others, if necessary) for later analysis and/or debugging operations.

As described in more detail, herein, aspects of the present disclosure can allow for the implementation of multiple timers to determine that an error or failure has occurred in the hardware I/O path. I/O paths associated with various PFs can be suspended while portions of the NVMe SSD controller (e.g., the frontend circuitry and/or the backend circuitry) are reset. A recovery operation can be performed to ensure that pending in-flight commands are completed and operations can be performed to ensure data integrity during the recovery operation. By performing the operations described herein, a hardware I/O error or failure can be resolved in the absence of user intervention (e.g., in the absence of performance of a power cycle operation performed by a user). Accordingly, performance of NVMe SSDs, and hence a computing system in which the NVMe SSD(s) are deployed can be improved in comparison to the approaches described above.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing device 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor. In some embodiments, the memory sub-system controller 115 is part of the hardware-based I/O path 310 and/or is coupled thereto illustrated in FIG. 3-1 and FIG. 3-2, herein.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a recovery component 113. Although not shown in FIG. 1 so as to not obfuscate the drawings, the recovery component 113 can include various circuitry to facilitate performance of operations described herein. The recovery component 113 may be referred to herein in the alternative as a "controller" or a "processor," given the context of the disclosure. In some embodiments, the recovery component 113 can include special purpose circuitry in the form of an ASIC, FPGA, state machine, and/or other logic circuitry that can allow the recovery component 113 to orchestrate and/or perform operations described herein involving the memory device 130 and/or the memory device 140.

In some embodiments, the memory sub-system controller 115 includes at least a portion of the recovery component 113. For example, the memory sub-system controller 115 can include a processor 117 (processing device) configured to execute instructions stored in local memory 119 for performing the operations described herein. In some embodiments, the recovery component 113 is part of the host system 110, an application, or an operating system.

In some embodiments, the memory sub-system 110, and hence the recovery component 113, can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

Figure 2:
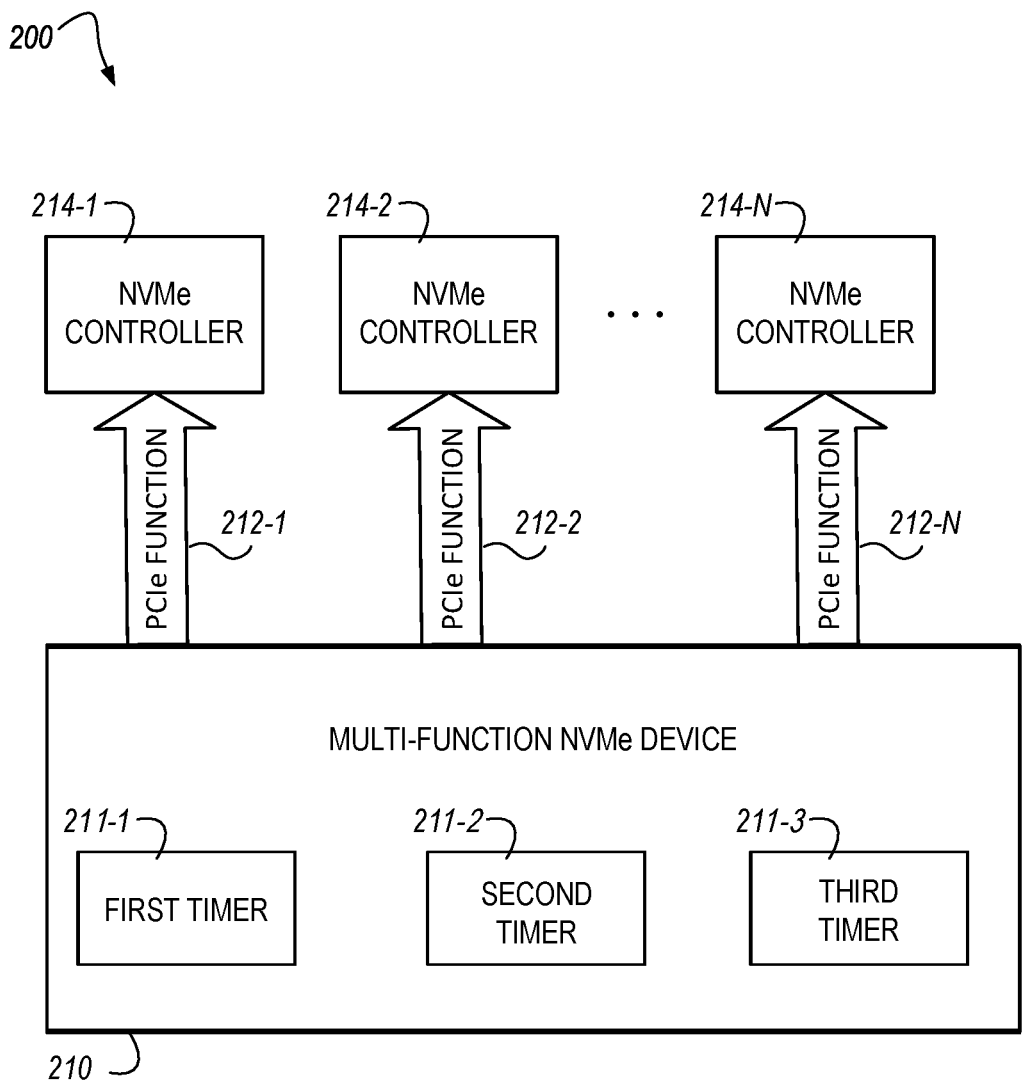
FIG. 2 illustrates an example multi-function non-volatile memory express device in accordance with some embodiments of the present disclosure.

FIG. 2 illustrates an example multi-function non-volatile memory express (NVMe) device 210 in accordance with some embodiments of the present disclosure. As shown in FIG. 2, the multi-function NVMe device is included in a computing system 200 that includes a plurality of PCIe functions 212-1, 212-2 to 212-N (collectively referred to herein as PCIe functions 212-1 to 212-N or for brevity, PCIe functions 212) that are coupled to respective NVMe controllers 214-1, 214-2, to 214-N (collectively referred to herein as NVMe controllers 214-1 to 214-N or for brevity, NVMe controllers 214). The computing system 200, or portions thereof, may be referred to herein in the alternative as an "apparatus."

In some embodiments, the PCIe functions 212-1 to 212-N can be physical functions (PFs). In general, a PCIe PF can provide single-root input/output virtualization (SR-IOV) capability and can manages the SR-IOV functionality. PFs are fully featured PCIe functions that can be discovered, managed, and manipulated like any other PCIe device. In addition, PFs can be used to configure and control a PCIe device. Embodiments are not so limited, however, and in some embodiments, the PCIe function 212-1 to 212-N can be virtual functions (VFs). In general, VFs are PCI functions that are associated with a physical function. For example, a VF can be a lightweight PCIe function that shares one or more physical resources with the PFs and with VFs that are associated with that PF. Unlike a physical function, a VF can generally only configure its own behavior.

The NVMe controllers 214-1 to 214-N can include logic for NVMe operations that are is physically stored within and executed by the NVMe controller 214-1 to 214-N. As shown in FIG. 2, the NVME controllers 214-1 to 214-N are physically co-located with the storage media, such as the media 330/340 illustrated in FIG. 3-2, herein of the multi-function NVMe device 210. The multi-function NVMe device 210 can be analogous to the memory sub-system 110 illustrated in FIG. 1, or a portion thereof. The multi-function NVMe device 210 is described in more detail in connection with FIG. 3-1 and FIG. 3-2, herein.

As shown in FIG. 2, the multi-function NVMe device 210 can include one or more timers (e.g., the first timer 211-1, the second timer 211-2, and the third timer 211-3). The timers are described in more detail, below; however, it is noted that each of the timers can correspond to a timeout timer associated with performance of the seamless recovery operations described herein. For example, the first timer 211-1 can be a PCIe completion timeout timer, the second timer 211-2 can be an inflight I/O timeout timer, and the third timer 211-3 can be a PF recovery timeout timer. The timers 211 can be implemented in hardware (e.g., as hardware counters) or can be implemented in hardware in response to execution of machine-readable instructions associated with the multi-function NVMe device 210.

In a non-limiting example, an apparatus, such as the computing system 200, can include a plurality of physical functions 212 associated with one or more controllers 214 and a memory device (e.g., the multi-function NVMe device 210) coupled to the controller(s) 214. The controller(s) 214 can receive signaling indicative of performance of a reset operation involving at least one physical function (e.g., the PF 212-1) among the plurality of physical functions 212 and can initiate a first timer 211-1 that corresponds to an amount of time available for at least the one physical function 212-1 among the plurality of physical functions 212 to complete execution of pending commands.

The controller(s) 214 can initiate a second timer 211-2 that corresponds to an amount of time available for at least one additional physical function (e.g., the PF 212-2) among the plurality of physical functions 212 to complete execution of pending commands and can initiate a third timer 211-3 that corresponds to an amount of time available for at least the one additional physical function to join a recovery operation that is instigated as a result of performance of the reset operation. The controller(s) 214 can further control, upon completion of the third timer 211-3, performance of the recovery operation involving at least the one physical function 212-1/212-N among the plurality of physical functions 212 and at least the one additional physical function 212-2 among the plurality of physical functions 212.

Continuing with this non-limiting example, the signaling indicative of performance of the reset operation involving at least the one physical function among the plurality of physical functions 212 can be generated in response to a determination that an input/output path (e.g., the hardware-based I/O path 310 illustrated in FIG. 3-1 and FIG. 3-2, herein) coupled to the controller(s) 214 has experienced a failure.

In some embodiments, the controller(s) 214 can, in response to completion of the first timer, suspend data transfer across input/output paths corresponding to each physical function 212-1 to 212-N among the plurality of physical functions 212. In such embodiments, the controller(s) 214 can be further configured to route data transfers across the input/output paths corresponding to each physical function among the plurality of physical functions to firmware associated with the controller. In some embodiments, the controller(s) 214 can be configured to reset backend circuitry (e.g., the backend circuitry 303 illustrated in FIG. 3-2, herein) associated therewith and reset frontend circuitry (e.g., the frontend circuitry 301 illustrated in FIG. 3-1, herein) associated therewith subsequent to suspension of the data traffic across the input/output paths corresponding to each physical function 212-1 to 212-N among the plurality of physical functions 212.

Continuing with this non-limiting example, the controller(s) 214 can be configured to reset a non-volatile memory express (NVMe) interface (e.g., the NVMe circuitry 323 illustrated in FIG. 3-1, herein) associated therewith as part of performance of the recovery operation. In such embodiments, the controller(s) 214 may be configured to reset the non-volatile memory express (NVMe) interface associated therewith without resetting a peripheral component interconnect express (PCIe) interface (e.g., the PCIe circuitry 321 illustrated in FIG. 3-1, herein) associated with the controller(s) 214. In addition to, or in the alternative, the controller(s) 214 can be further configured to reset a command table (e.g., the FE CMD TABLE 331 and/or the BE CMD TABLE 333 illustrated in FIG. 3-1, herein) associated therewith in response to resetting the NVMe interface associated with the controller(s) 214 as part of performance of the recovery operation.

As described in more detail herein, in some embodiments, the first timer 211-1 can corresponds to an amount of time required by a peripheral component interconnect express interface to complete execution of the pending commands associated with the first physical function 212-1. In addition, in some embodiments, a total sum of the amounts of time allotted to the first timer 211-1, the second timer 211-2, and the third timer 211-3 is less than an amount of time associated with a timeout value of a host (e.g., the host system 120 illustrated in FIG. 1, herein) coupled to the controller(s) 214 and/or the memory device.

Figures 1, 3:
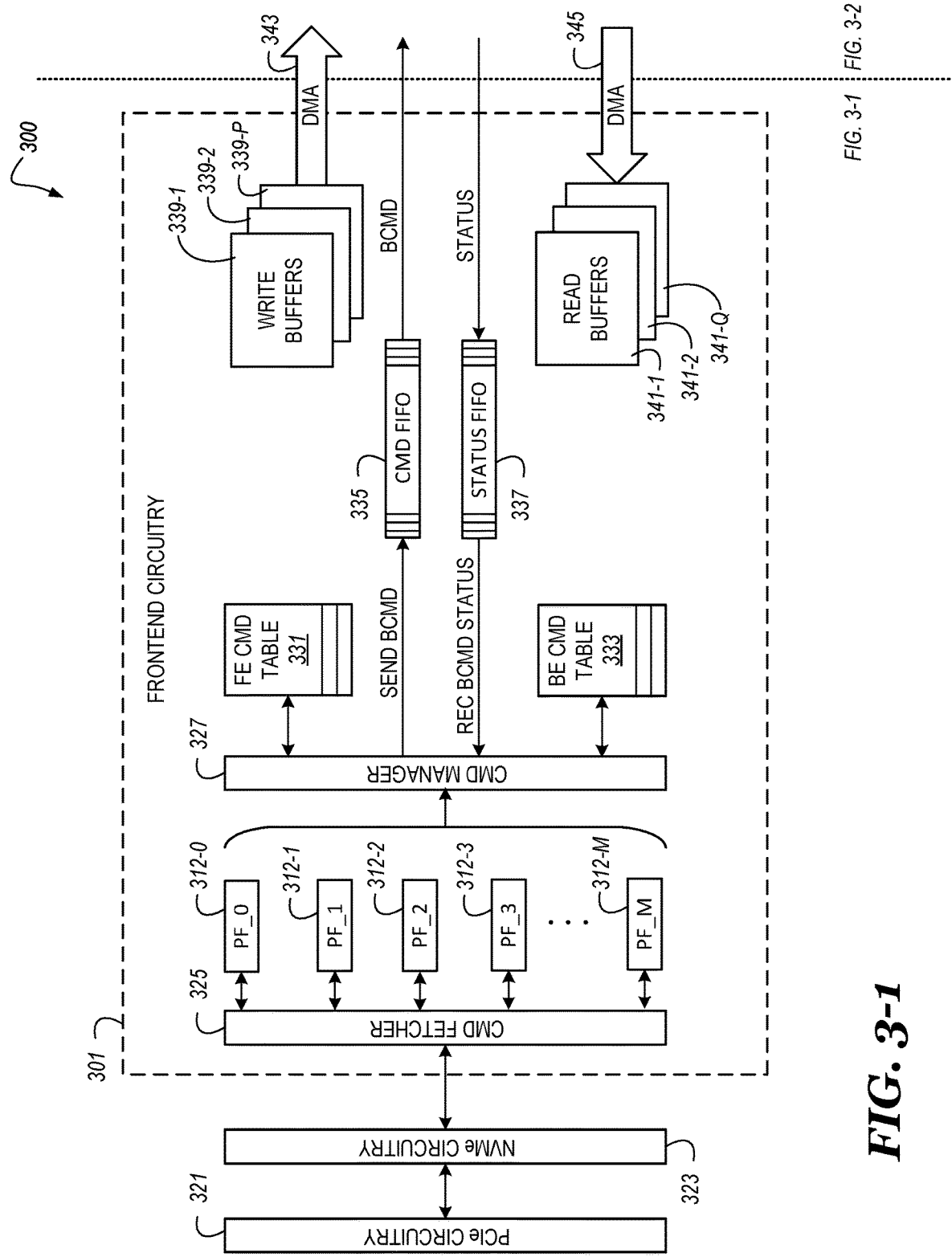
Figures 2, 3:
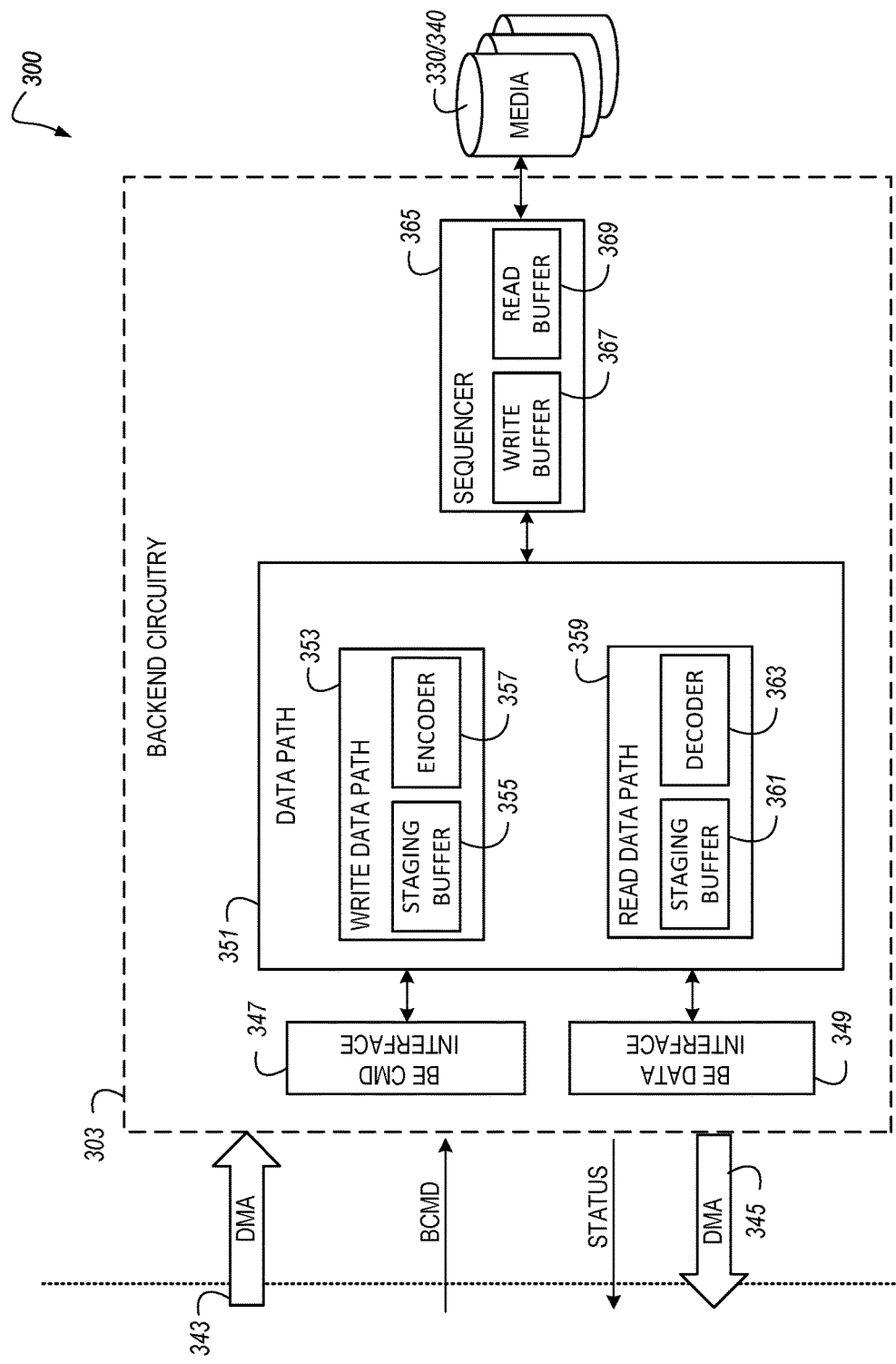

FIG. 3-1 and FIG. 3-2 illustrate an example of a hardware-based input/output (I/O) path 310 for a multi-function NVMe device in accordance with some embodiments of the present disclosure. The hardware-based input/output (I/O)

path 310 can be at least a portion of a controller or media controller and can therefore be referred to herein as a "controller" or "media controller," which can be analogous to the memory sub-system controller 115 illustrated in FIG. 1. In particular, the backend circuitry 303 can, in some embodiments, comprise a "controller" or "media controller," such as the memory sub-system controller 115 illustrated in FIG. 1. The multi-function NVMe device can be analogous to the memory sub-system 110 illustrated in FIG. 1 and/or the multi-function NVMe device 210 illustrated in FIG. 2, herein. The multi-function NVMe device can serve read/write I/Os through the hardware-based based I/O path 310 shown FIG. 3-1 and FIG. 3-2, which may follow an internal hardware architecture as shown FIG. 3-1 and FIG. 3-2. In the example architecture illustrated in FIG. 3-1 and FIG. 3-2 there is no Firmware intervention in serving I/Os.

As shown in FIG. 3-1 and FIG. 3-2, The hardware-based input/output (I/O) path 310 includes frontend circuitry 301 and backend circuitry 303. The frontend circuitry 301 is coupled via a command fetcher 325 to a non-volatile memory express (NVMe) circuitry 323, which is coupled to peripheral component interconnect express (PCIe) circuitry 321. In some embodiments, the NVMe circuitry 323 and/or the PCIe circuitry 321 can expose thirty-two (32) NVMe controllers (e.g., the NVMe controllers 214 illustrated in FIG. 2, herein) to a host (e.g., the host 120 illustrated in FIG. 1, herein). Each NVMe controller has a dedicated Admin Queue and certain number of I/O Queues per physical function 312. The NVMe circuitry 323 can receive commands sent by the host and can store necessary NVMe command details in its command table (not shown in FIG. 3-1 so as to not obfuscate the drawing layout). This command table can hold NVMe commands from PFs 314 based on an order in which the commands are fetched from the host. Although thirty-two (32) NVMe controllers are described in this example, embodiments are not so limited and embodiments in which greater than thirty-two (32) NVMe controllers and embodiments in which fewer than thirty-two (32) NVMe controllers are exposed the host are contemplated.

The frontend circuitry 301, backend circuitry 303, NMVe circuitry 323 and/or the PCIe circuitry 321 can comprise one or more cores (e.g., "intellectual property (IP) cores"). As used herein, a "core" or "IP core" generally refers to one or more blocks of data and/or logic that form constituent components of an application-specific integrated circuit or field-programmable gate array. Accordingly, the frontend circuitry 301, backend circuitry 303, NMVe circuitry 323 and/or the PCIe circuitry 321 includes hardware circuitry that is configured to perform the tasks and functions described herein.

As shown in FIG. 3-1, the command fetcher 325 is coupled to multiple physical functions 312-0, 312-1, 312-3, 312-4, to 312-M (referred to herein as "PF_0 213-1 to PF_M 312-M" or the "PFs 312" for brevity). The PFs 312 are coupled to a command manager 327, which is, in turn coupled to a frontend command table 331 and a backend command table 333. The command manager 327 is further coupled to a command buffer (the CMD FIFO 335) and a status buffer (the status FIFO 337). As indicated in FIG. 3-1, the command buffer and the status buffer can operate according to a "first-in-first out" (FIFO) protocol.

The command fetcher 325 fetches commands from the NVMe circuitry 323 for all PFs 312 and pushes these commands into a command buffer (the CMD FIFO 335), which can be specific for each of the PFs 312. In some embodiments, the PFs 312 can be analogous to the PCIe functions 212-1 to 212-N illustrated in FIG. 1, herein. Accordingly, in some embodiments, the PFs 312 can be ports that are fully featured PCIe functions that can be discovered, managed, and manipulated like any other PCIe device. In addition, the PFs 312 can be used to configure and control a PCIe device via, for example, the PCIe circuitry 321.

In some embodiments, the command fetcher 325 can separate commands meant for the firmware running on an embedded processor from the hardware-based (I/O) path 310. In some embodiments, there can be a dedicated command buffer (not shown so as to not obfuscate the drawings) where the command fetcher 325 pushes commands that are to be resolved with firmware intervention. Other I/O commands can be pushed into the command buffer 335. The commands pushed to the command buffer 335 can be condensed into smaller commands so that they contain only necessary information needed by the hardware-based (I/O) path 310 for processing.

In some embodiments, the command manager 327 can store the condensed commands in the frontend command table 331. Entries in frontend command table 331 can include a direct mapping into another entry in an NVMe command table that is part of NVMe circuitry 323. The command manager 327 generates a backend command (BCMD) and allocates write buffers 339-1, 339-2, to 339-P and/or read buffers 341-1, 341-2, to 341-Q to process write and/or read commands for the hardware-based (I/O) path 310. Upon allocation of the write buffers 339-1, 339-2, to 339-P and/or read buffers 341-1, 341-2, to 341-Q, the command manager 327 can provide an indication to the NVMe circuitry 323 to perform a direct memory access (DMA) involving data to transfer the data into the write buffers 339-1, 339-2, to 339-P and/or read buffers 341-1, 341-2, to 341-Q. Once the data has been transferred to the write buffers 339-1, 339-2, to 339-P and/or read buffers 341-1, 341-2, to 341-Q and the command manager computes internal logical block address information to be used for reading and/or writing data, the BCMD can be issued to the backend circuitry 303 for further processing. In some embodiments, the command manager 327 may also maintains a backend command table 333 to store the BCMDs that have been sent and to track when operations are completed by the backend circuitry 303.

As mentioned above, the hardware-based (I/O) path 310 can be included in a controller, such as a media controller (e.g., the media sub-system controller 115 illustrated in FIG. 1, herein). For example, in some embodiments, the backend circuitry 303 can be at least a portion of a media controller. In such embodiments, the backend circuitry 303 interacts with the frontend circuitry 301 through a backend command interface 347 and backend data interface 349. Accordingly, within the backend circuitry 303 (or "media controller") the backend command interface 347 and backend data interface 349 can be divided into a control path and a data path 351. The control path generally handles command processing, address translation, data path management, and media command interface. Concurrently, the data path 351 handles data direct memory access (DMA), redundant array of independent disks (RAID) processing, and error correction code (ECC) encoding and decoding. In some embodiments, the data path 351 can comprise multiple channels.

In some embodiments, read/write commands received by the backend circuitry 303 from the frontend circuitry 301 (e.g., commands received via the backend command interface 347 and transferred to the data path 351) can be divided into die commands and/or media commands. Data received from the frontend circuitry 301 (e.g., data received via a DMA involving the write buffers 339-1 to 339-P) can be transferred to the staging buffer 355 of the data path 351. In some embodiments, RAID protection can be provided to the data that will be transferred via the write data path 353. The data can further be encoded using the encoder 357 and subsequently copied to the sequencer 365 (e.g., to the write buffer 367 of the sequencer 365) prior to being written to the media 330/340.

For the read path, data is retrieved from the media 330/340 and transferred to the read buffer 369 of the sequencer 355. The data is then decoded by the decoder 363 of the read path 359 and copied to the staging buffer 361 of the read path 359. The data is then transferred into the read buffers 341-1, 341-2, to 341-Q of the frontend circuitry 301 and transferred through the frontend circuitry 301 to the host.

In some scenarios, a host (e.g., the host 120 illustrated n FIG. 1, herein) can initiate a reset (e.g., apply signaling indicative of a reset operation) of one or more PFs 312 simultaneously. In general, when the host issues a rest, such as a NVMe controller reset to a PF 312, the NVMe device handles it as follows. The NVMe circuitry 323 can, upon receiving the reset from the host, generate an event/interrupt to firmware associated with a multi-function NVMe device. The reset can be asserted on any one or multiples ones of the PFs 312.

As part of performing the reset operation, firmware associated with the multi-function NVMe device suspends the I/O paths associated with any PFs 312 that are to be reset. The firmware then generates a timer for completion of in-flight I/O commands (e.g., a PCIe completion timer) and aborts execution of admin commands associated with the PFs 312 to be reset. Next, all I/O commands associated with the PF(s) 312 to be reset on the command buffer 335 are aborted. In such scenarios, I/O commands in the PFs 312 that have already been processed and are executing their completion path will be completed to the host via firmware.

The Firmware can then wait till the outstanding commands on the PFs 312 to be reset becomes zero (e.g., all the outstanding commands for the PFs 312 to be reset have been executed by the firmware). In a normal case, the outstanding command count will become zero, upon which the firmware will cancel the PCIe completion timer and then reset the controller configuration registers and admin queue registers for the PFs 312 that were reset.

The host can then issue a controller enable signal involving the PFs 312 that were reset and the NVMe circuitry 323 can assert an interrupt to the firmware indicating that the reset operation is complete. The firmware can then control operations to configure the admin queue registers for the reset PFs 312, resume the I/O path, and generate an indication that the reset PFs 312 are ready to resume processing I/O and/or admin commands.

However, as mentioned above, for a multi-function SSD with multiple (NVMe) PFs 312 transferring data and/or commands, when the host is running I/Os on one or multiple PFs 312, if an I/O timeout occurs due to an issue hardware-based (I/O) path 310, then either one or multiple PFs 312 may encounter NVMe controller resets or PCIe function level resets (FLR) from the host. In such scenarios, conventional approaches generally determine that the fault or failure (e.g., a "bug") has occurred in hardware logic of the hardware-based (I/O) path 310 and attempt to capture a state of the hardware by collecting information stored in registers of the frontend circuitry 301, the backend circuitry 303, the NVMe circuitry 323, and/or the PCIe circuitry 321. Such approaches then generally perform an operation to block the firmware from attempting to perform a recovery operation to remedy the fault or failure. The host then sends signaling indicative of a reset (e.g., one or more reset commands) operation to the PFs 312 that have experienced a command timeout as a result of the fault or failure. This eventually leads to the host dropping the afflicted PFs 312 from a list of NVMe devices that the host manages.

Once the host has dropped the afflicted PFs 312 from the list of NVMe devices that the host manages, such approaches rely on user intervention in the form of a power cycle of the host and/or the multi-function SSD to recover the PFs 312 that were dropped from the list of NVMe devices managed by the host. Further, user intervention is generally required in such approaches to collect the state (e.g., the data stored in the registers of the frontend circuitry 301, the backend circuitry 303, the NVMe circuitry 323, and/or the PCIe circuitry 321) that was collected in response to the fault or failure (e.g., the "bug") that had occurred in hardware logic of the hardware-based (I/O) path 310. In t least some of these conventional approaches, the state can only be collected using vendor specific commands and is generally analyzable only by an engineering team (as opposed to a user of the multi-function SSD).

In contrast, embodiments herein allow for seamless recovery of a hardware-based I/O path 310 in a multi-function NVMe SSD in the absence of user intervention. For example, embodiments described herein can allow for hardware circuitry to execute instructions corresponding to firmware to cause performance of operations to recover the hardware from a failure or fault condition while ensuring that I/O transactions continue to run uninterrupted on all PFs 312.

In some embodiments, after a determination has been made that a fault or failure has occurred in the hardware-based I/O path 310 in a multi-function NVMe SSD, multiple timers can be generated and various operations can be performed prior to expiration of the multiple timers. For example, embodiments herein contemplate the use of, at minimum, three separate timers that are based on different events and/or completion of events to seamless recovery of a hardware-based I/O path 310 in a multi-function NVMe SSD in the absence of user intervention.

In some embodiments a PCIe completion timeout timer (e.g., a "first timer," such as the first timer 211-1 illustrated in FIG. 2) can be generated and used to provide a sufficient amount of time for the hardware-based I/O path 310 to ensure that in-flight I/O commands for a specific PF 312 (e.g., a PF that is affected by the fault or failure and has therefore receive signaling indicative of performance of a reset operation from the host) to be completed within a period of time associated with the specific PF 312 that has received a signaling indicative of a reset operation from the host. In at least one embodiment, the PCIe completion timeout timer has an expiry time of around 50 milliseconds (ms); however, the expiry time of the PCIe completion timeout timer can be configured to be shorter than, or longer than 50 ms.

An in-flight I/O timeout timer (e.g., a "second timer," such as the second timer 211-2 illustrated in FIG. 2) can be generated and used to ensure that outstanding in-flight commands on PFs 312 that have not received signaling indicative of performance of a reset operation from the host (e.g., PF(s) that are not affected by the fault or failure and has therefore have not receive signaling indicative of performance of a reset operation from the host) are provided an amount of time to be completed. In general, the in-flight I/O timeout timer is generated (e.g., "spawned") only after suspending the I/O path(s) associated with all of the PFs 312 of the hardware-based I/O path 310. In at least one embodiment, the on-flight I/O timeout timer has an expiry time of around 10 ms; however, the expiry time of the in-flight I/O timeout timer can be configured to be shorter than, or longer than 10 ms.

Further, a PF recovery timeout timer (e.g., a "third timer," such as the third timer 211-3 illustrated in FIG. 2) can be generated and used to ensure that, before a hardware recovery phase begins, that all of the PFs 312 that may be involved in a host initiated reset operation due to a potential I/O timeout are received before the PF recovery timeout time expires. This can allow for multiple PFs to participate in the PF recovery process described in more detail below together, which can minimize the need to reset hardware components multiple times. In at least one embodiment, the PF recovery timeout timer has an expiry time of 500 ms; however, the expiry time of the PF recovery timeout timer can be configured to be shorter than, or longer than 500 ms.

In some embodiments, the total allotted for completion of the PCIe completion timeout timer, the in-flight I/O timeout timer, and the PF recovery timeout timer can be less than a time corresponding to a timeout value associated with the host after which one or more of the PFs 312 may be dropped from the list of NVMe devices that the host manages.

Subsequent to generation of the timers described above, the hardware I/O path corresponding to the PFs 312 can be suspended. For example, commands and/or signaling can be generated to temporarily pause data traffic transferred via the hardware I/O path to the PFs 312. In some embodiments, the traffic transferred via the hardware I/O path to the PFs 312 can be suspended when the PCIe completion timeout time expires, as expiration of the PCIe completion timeout timer can correspond to a determination that the hardware I/O path is taking longer than an expected time to complete the outstanding I/O commands back to the host for the PF 312 to which the host has sent the signaling indicative of the reset operation.

In some embodiments, the frontend circuitry 301 and/or the backend circuitry 303 can be reset to remedy the fault or failure in the hardware-based I/O path 310. It is desirable that data stored in the write buffers 339-1 to 339-P (e.g., dirty data stored in the write buffers) of the hardware-based I/O path 310 and the data in the frontend command table 331 and the data in the backend command table 333 are not cleared or reset during the reset of the frontend circuitry 301 and/or the backend circuitry 303.

In general, the frontend circuitry 301 and/or the backend circuitry 303 can be reset by first resetting the frontend circuitry 301 and subsequently resetting the backend circuitry 303. Once the frontend circuitry 301 and the backend circuitry 303 are reset, the backend circuitry 303 can be released from the rest condition, after which the frontend circuitry 301 can be released from the reset condition. In some embodiments, it is noted that circuitry that interfaces with the host (e.g., the PCIe circuitry 321 and/or the NVMe circuitry 323) are not rest when the frontend circuitry 301 and/or the backend circuitry 303 are reset.

Once the frontend circuitry 301 and the backend circuitry 303 are reset, all pending in-flight commands involving the PFs 312 can be monitored. For each specific pending in-flight command, if the PF 312 involving the pending in-flight command is being reset, that or those specific pending in-flight commands can be removed from the frontend command table 331 and/or the backend command table 333. In contrast, for pending in-flight commands involving PFs 312 that are not being reset, the command can be returned to the host with an indication that the command failed to be executed and can later be retried.

Subsequently, any commands associated with the backend circuitry 303 that have not been committed to the media 330/340 (e.g., dirty backend commands) can be re-issued to the backend circuitry 303. In some embodiments, these commands are re-issued by the host. By re-issuing these backend commands, data integrity to be ensured. The backend circuitry 303 can then flush the dirty BCMD to ensure it gets completed.

At this point, the operation to seamlessly recover the hardware-based I/O path 310 in a multi-function NVMe SSD can be complete. To finalize the recovery operation, the hardware-based I/O path 310 for each of the PFs 312 that were involved in a recovery operation can be resumed and an indication that these PFs 312 are ready to resume receipt of commands and/or other data traffic can be generated and transferred to the host. For those PFs 312 that were not subject to the recovery operation, the hardware-based I/O path 310 can be resumed to allow commands and other data traffic to be transferred thereto and therefrom.

Although mentioned above that the circuitry that interfaces with the host (e.g., the PCIe circuitry 321 and/or the NVMe circuitry 323) are not rest when the frontend circuitry 301 and/or the backend circuitry 303 are reset, embodiments are not so limited. For example, in at least one embodiment, the NVMe circuitry 323 can be reset when the frontend circuitry 301 and/or the backend circuitry 303 are reset. This can be achieved by resetting the NVMe circuitry 323 without compromising the PCIe circuitry 321 connection. For example, in such embodiments, the NMVe circuitry 323 can be disconnected for a short time from the PCIe circuitry 321, during which time the NVMe circuitry 323 can be reset and reinitialized. In embodiments in which the NVMe circuitry 323 is reset, the Command Table may also get reset, which is preferable to ensure a more robust recovery. In this case, prior to resetting the NVMe circuitry 323, firmware of the hardware-based I/O path 310 can read entries in the command table(s) (e.g., the frontend command table 331, the backend command table 333, and/or a command table that is internal to the NVMe circuitry 323), identify the outstanding commands that need to be transferred to the host, and create a command list that stores a command identification ("command ID" or "CID") and a queue identification ("queue ID" or "QID") for each of these commands. The CID and the QID can refer to a type of command and the position of the command in queue for each command in the command list. This list can then be used to send error command completion to the host using an NVMe forced command completion operation, which does not rely on the command table(s).

A non-limiting, illustrative example involving participation of three PFs 312 that have received signaling indicative of performance of a reset operation from the host due to an I/O timeout event in PF recovery process to resolve the hardware fault or failure condition and ensure that I/O processing continues by all three PFs 312 in accordance with some embodiments of the disclosure is provided below.

When an I/O timeout involving a first PF (for purposes of this example "PF_0 312-0) is detected by a host (e.g., the host 120 illustrated in FIG. 1), the host can send signaling indicative of performance of a reset operation involving the first PF 312-0 to one or more components of the hardware-based I/O path 310 of a multi-function SSD. Responsive to the signaling indicative of performance of the reset operation involving the first PF 312-0, the NVMe circuitry 323 can generate and/or transfer an interrupt signal to notify the firmware of the multi-function SSD.

When the interrupt signal is received and/or processed by firmware of the multi-function SSD, the host and/or one or more components of the hardware-based I/O path 310 can cause the I/O path associated with the first PF 312-0 to be suspended and can control routing of subsequent commands and/or data traffic associated with the first PF 312-0 that are transferred via the I/O path associated with the PF 312-0 to firmware associated with the hardware-based I/O path 310. A first timer (e.g., the PCIe completion timeout timer described above) can be initiated. Subsequent to initiation of the first timer, admin commands associated with the first PF 312-0 and I/O commands associated with buffers (e.g., the CMD FIFO 335 and/or the STATUS FIFO 337) associated with the PF 312-0 are aborted.

The Firmware the periodically checks to determine if I/O commands are still pending on the first PF 312-0 before the PCIe completion timer expires for the first PF 312-0. In the meantime, the host (e.g., the host system 120 illustrated in FIG. 1) may detect an I/O timeout on a second PF (e.g., the PF 312-1) and sends signaling indicative of a reset to the second PF 312-1. Upon receipt of the signaling indicative of the reset involving the second PF 312-1, the NVMe circuitry 323 notifies the firmware. The firmware performs the same operations mentioned above to handle the reset for the second PF 312-1. In addition, the firmware checks periodically to determine if I/O commands are pending involving the second PF 312-1 before the PCIe completion timer expires for the second PF 312-1.

When the PCIe completion timer expires for the first PF 312-0, the firmware marks this as a PF recovery start and suspends the I/O path for the remaining PFs. The firmware then initiates a second timer (e.g., the inflight timer described above) for the first PF 312-0 for outstanding commands to complete on PFs that are not subject to a reset operation. The host can then detect an I/O timeout on a third PF (e.g., the PF 312-2) and can send signaling indicative of a reset operation to the PF 312-2. The NVMe circuitry 323 can, upon receipt of the signaling indicative of the reset involving the PF 312-2, notify the firmware. The firmware can then suspend the I/O path for the third PF 312-2 and admin commands and I/O commands present in the buffers associated with the third PF 312-2 can be aborted. The firmware can then reset controller configuration registers and admin queues associated with the third PF 312-2. In this example, since the firmware has already caused the PF recovery operation to commence, the third PF 312-2 can join the PF recovery operation and can wait for completion of the recovery operation to proceed.

When the second timer (e.g., the inflight timer) expires for the first PF 312-0, the firmware can reset the controller configuration registers and admin queues associated with the first PF 312-0 and the first PF 312-0 can join the PF recovery operation. In this example, the firmware can initiate a third timer (e.g., the PF Recovery timer described above) for other PFs to join the PF recovery operation to which the host may send signaling indicative of a reset operation to due to an I/O timeout. When the first timer expires for the second PF 312-1, and if a PF recovery operation is in progress, the firmware can reset controller configuration registers and admin queues associated with the second PF 312-1, and the second PF 312-1 can wait for completion of the recovery operation to proceed.

Once the third timer expires, the recovery operation can be commenced as follows. First, hardware circuitry can be reset in the following order: frontend circuitry 301 is reset followed by backend circuitry 303. Subsequently, the backed circuitry 303 is released from the reset condition and then the frontend circuitry 301 is released from the reset condition. In some embodiments, the NVMe circuitry 323 and/or the PCIe circuitry 321 may not be reset during these operations.

Subsequently, pending inflight commands associated with the PFs 312 can be checked. During this operation, for specific commands associated with the PFs 312, if the PF 312 is subject to the reset operation, commands corresponding thereto are deleted from the command table (e.g., the FE CMD TABLE 331 and/or the BE CMD TABLE 333). If the PF 312 is not subject to the reset operation, commands corresponding thereto may be failed and returned to the host with a NAMESPACE_NOT_READY flag and/or a DNR=0 flag. For these commands, the host may subsequently retry the commands at a later time.

Any partially completed (e.g., "dirty") commands associated with the backend circuitry 303 can re-issued to ensure data integrity. During this operation, the backend circuitry 303 can flush dirty BCMD and ensure that such dirty commands are completed.

Finally, the PF recovery operation is marked as being completed. For PFs that were not subjected to the reset operation, I/O paths associated therewith may be resumed. In contrast, for PFs that were subject to the reset operation, the hardware I/O path may be resumed and the host will send a signal indicating that the y hardware I/O path can be resumed.

In a non-limiting example, an apparatus can include a memory controller (e.g., the memory sub-system controller 115 illustrated in FIG. 1, herein) that includes a frontend portion 301, a backend portion 303, a first physical function (e.g., the PF 312-1), and a second physical function (e.g., the PF 312-2). The memory controller can receive signaling indicative of performance of a reset operation involving the first physical function 312-1. As described herein, the signaling indicative of performance of the reset operation involving the first physical function 312-1 is generated in response to a determination that an input/output path (e.g., the hardware-based I/O path 310 coupled to the memory controller has experienced a failure.

The memory controller can then initiate a first timer (e.g., the first timer 211-1 illustrated in FIG. 2, herein) that corresponds to an amount of time available for the first physical function to complete execution of pending commands. The memory controller can initiate a second timer (e.g., the second timer 211-2 illustrated in FIG. 2, herein) that corresponds to an amount of time available for the second physical function 312-2 to complete execution of pending commands and initiate a third timer (e.g., the third timer 211-3 illustrated in FIG. 2, herein) that corresponds to an amount of time available for the second physical function 312-2 to join a recovery operation that is instigated as a result of performance of the reset operation. The memory controller can then control, upon completion of the third timer, performance of the recovery operation involving the first physical function and the second physical function. As described above, a total sum of the amounts of time allotted to the first timer, the second timer, and the third timer is less than an amount of time associated with a timeout value of a host (e.g., the host system 120 illustrated in FIG. 1, herein) coupled to the memory controller.

In some embodiments, the memory controller can include a third physical function 312-3 and can be configured to determine, during the amount of time available for the second physical function 312-2 to join a recovery operation that is instigated as a result of performance of the reset operation, that the third physical function 312-3 is to join the recovery operation and control, upon completion of the third timer, performance of the recovery operation involving the first physical function 312-1, the second physical function 312-2, and the third physical function 312-3.

Continuing with this non-limiting example, the memory controller reset a non-volatile memory express (NVMe) interface (e.g., the NVMe circuitry 323) associated therewith without resetting a peripheral component interconnect express (PCIe) interface (e.g., the PCIe circuitry 321) associated with the controller. In addition, the memory controller can be further configured to reset a command table (e.g., the FE CMD TABLE 331 and/or the BE CMD TABLE 333) associated therewith in response to resetting the NVMe interface associated with the memory controller as part of performance of the recovery operation.

In some embodiments, the memory controller can be configured to, in response to completion of the first timer, suspend data transfer across input/output paths corresponding to the first physical function 212-1 and the second physical function 212-2. The memory controller can then reset backend circuitry 303 associated therewith and reset frontend circuitry 301 associated with the memory controller subsequent to suspension of the data traffic across the input/output paths corresponding to the first physical function 312-1 and the second physical function 312-2. Embodiments are not so limited, however, and in some embodiments, the memory controller can suspend data transfer across input/output paths corresponding to the first physical function 312-1 and the second physical function 312-2 in response to completion of the first timer and route data transfers across the input/output paths corresponding to the first physical function 312-1 and the second physical function 312-2 to firmware associated with the memory controller.

Figure 4:
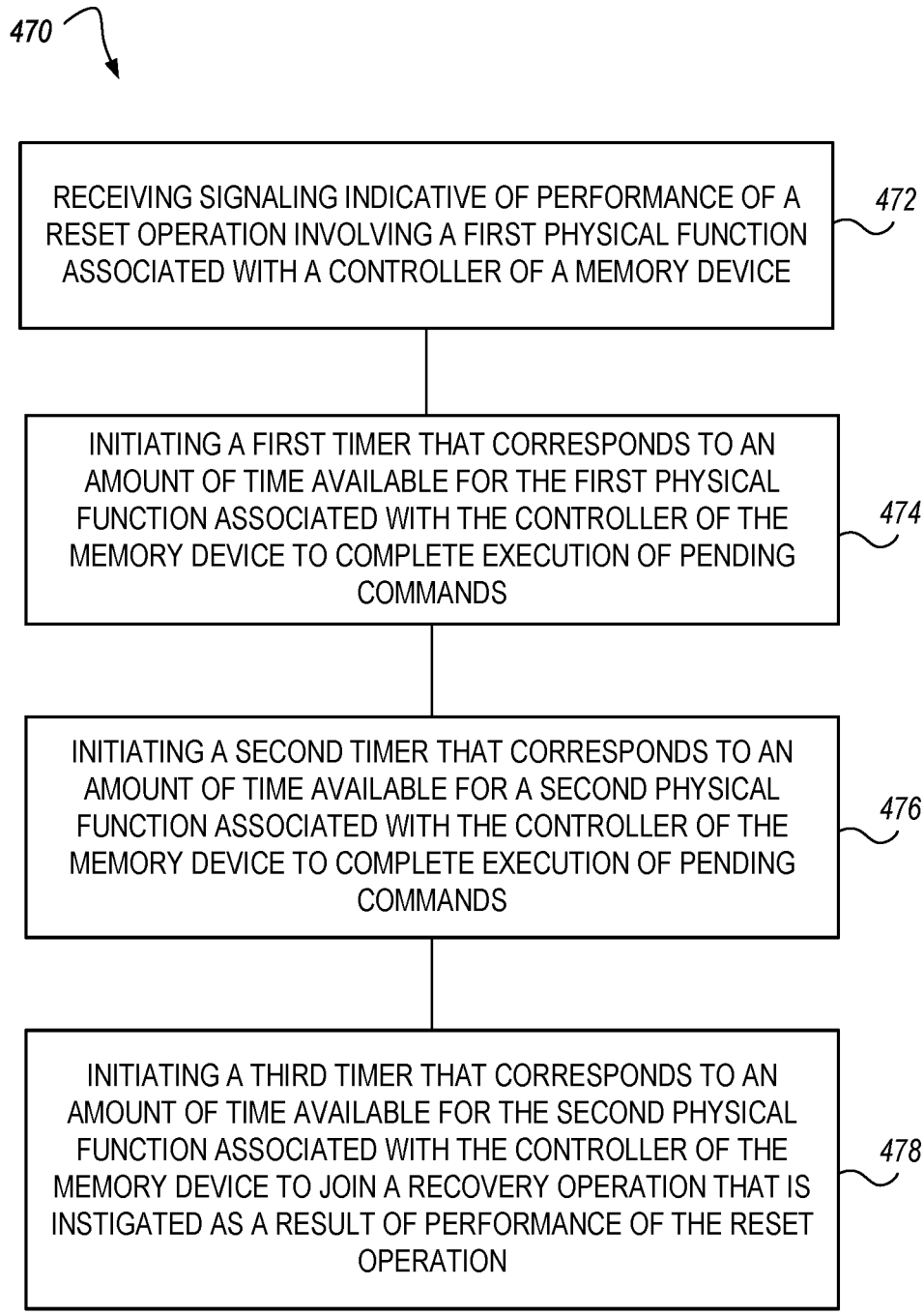
FIG. 4 is a flow diagram corresponding to a method for seamless recovery of a hardware-based I/O path in a multi-function NVMe SSD in accordance with some embodiments of the present disclosure.

FIG. 4 is a flow diagram corresponding to a method 470 for seamless recovery of a hardware-based I/O path in a multi-function NVMe SSD in accordance with some embodiments of the present disclosure. The method 470 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 470 is performed by the recovery component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 472, the method 470 includes receiving signaling indicative of performance of a reset operation involving a first physical function associated with a controller (e.g., the controller 115 illustrated in FIG. 1 or the controller 214 illustrated in FIG. 2, herein) of a memory device (e.g., the memory device 110 illustrated in FIG. 1 or the memory device 210 illustrated in FIG. 2, herein). The first physical function (PF) can be analogous to one of the PFs 212 illustrated in FIG. 2 or one of the PFs 312 illustrated in FIG. 3-1, herein.

At operation 474, the method 470 includes initiating a first timer (e.g., the first timer 211-1 illustrated in FIG. 2, herein) that corresponds to an amount of time available for the first physical function associated with the controller of the memory device to complete execution of pending commands. As described above, the first timer can correspond to an amount of time required by a peripheral component interconnect express interface to complete execution of the pending commands associated with the first physical function.

At operation 476, the method 470 includes initiating a second timer (e.g., the second timer 211-2 illustrated in FIG. 2, herein) that corresponds to an amount of time available for a second physical function associated with the controller of the memory device to complete execution of pending commands. The second physical function (PF) can be analogous to one of the PFs 212 illustrated in FIG. 2 or one of the PFs 312 illustrated in FIG. 3-1, herein.

At operation 478, the method 470 includes initiating a third timer (e.g., the third timer 211-3 illustrated in FIG. 2, herein) that corresponds to an amount of time available for the second physical function associated with the controller of the memory device to join a recovery operation that is instigated as a result of performance of the reset operation. The method 470 can further include performing the recovery operation involving the first physical function or the second physical function, or both upon expiration of the third timer.

In some embodiments, the second physical function has not received signaling indicative of performance of a reset operation involving the second physical function prior to the third timer being initiated. Further, as described above, a total sum of the amounts of time allotted to the first timer, the second timer, and the third timer can be less than an amount of time associated with a timeout value of a host (e.g., the host system 120 illustrated in FIG. 1, herein) coupled to the controller and/or the memory device.

In some embodiments, the method 470 can include setting the amount of time available for the first physical function associated with the memory device to complete execution of pending commands, the amount of time available for the second physical function associated with the memory device to complete execution of pending commands, and/or or the amount of time available for the second physical functions associated with the memory device to join a recovery operation that is instigated as a result of performance of the reset operation, based on one or more parameters of the memory device.

Figure 5:
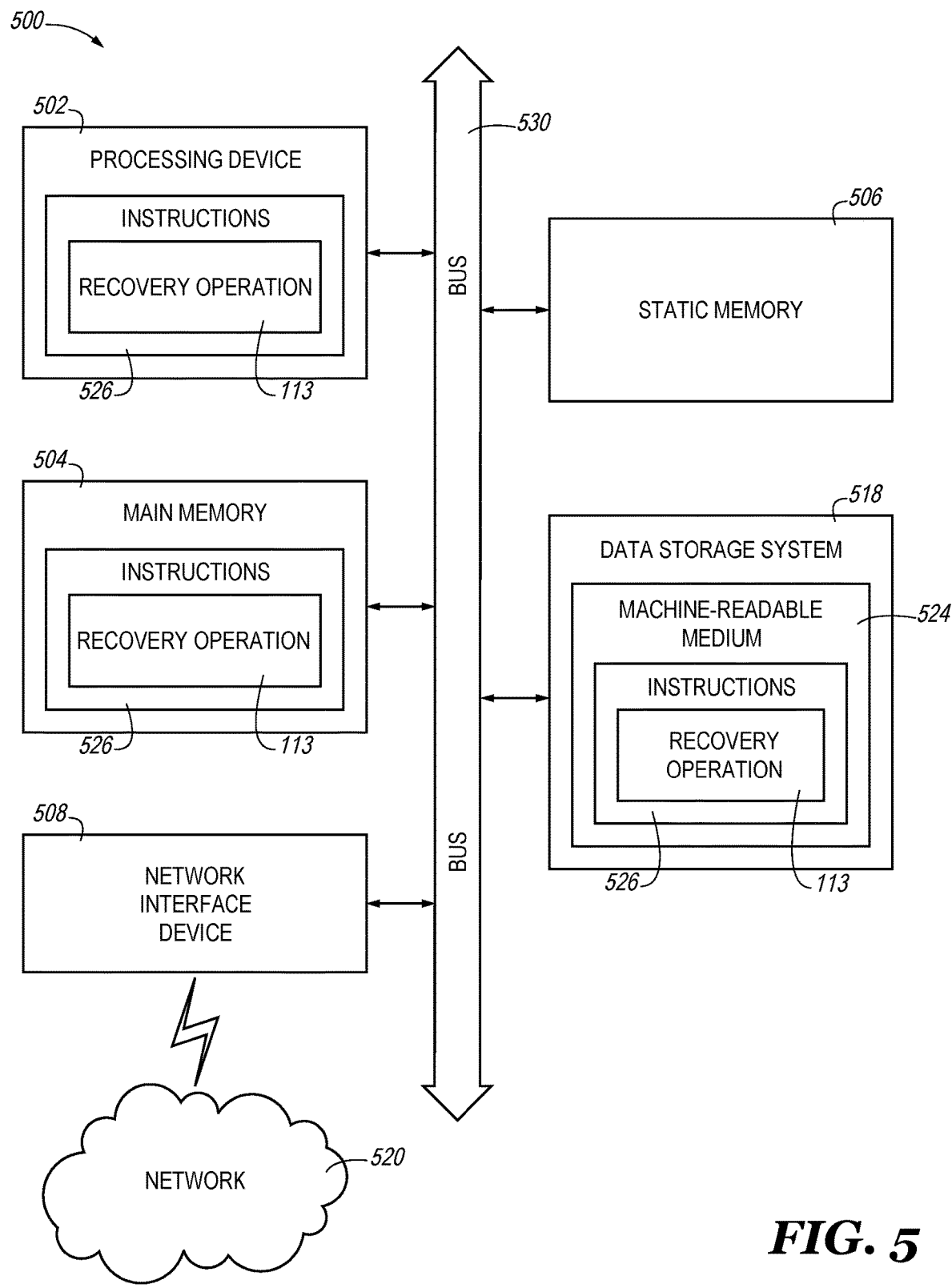
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the recovery component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a recovery component (e.g., the recovery component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   receiving signaling indicative of performance of a reset operation involving a first physical function associated with a controller of a memory device;
   initiating a first timer that corresponds to an amount of time available for the first physical function associated with the controller of the memory device to complete execution of pending commands;
   initiating a second timer that corresponds to an amount of time available for a second physical function associated with the controller of the memory device to complete execution of pending commands; and
   initiating a third timer that corresponds to an amount of time available for the second physical function associated with the controller of the memory device to join a recovery operation that is instigated as a result of performance of the reset operation.

2. The method of claim 1, further comprising performing the recovery operation involving the first physical function or the second physical function, or both upon expiration of the third timer.

3. The method of claim 1, wherein the second physical function has not received signaling indicative of performance of a reset operation involving the second physical function prior to the third timer being initiated.

4. The method of claim 1, wherein the first timer corresponds to an amount of time required by a peripheral component interconnect express interface to complete execution of the pending commands associated with the first physical function.

5. The method of claim 1, further comprising setting the amount of time available for the first physical function associated with the memory device to complete execution of pending commands, the amount of time available for the second physical function associated with the memory device to complete execution of pending commands, or the amount of time available for the second physical functions associated with the memory device to join a recovery operation that is instigated as a result of performance of the reset operation, or any combination thereof, based on one or more parameters of the memory device.

6. The method of claim 1, wherein a total sum of amounts of time allotted to the first timer, the second timer, and the third timer is less than an amount of time associated with a timeout value of a host coupled to the controller or the memory device, or both.

7. An apparatus, comprising:
   a plurality of physical functions associated with a controller; and
   a memory device coupled to the controller, wherein the controller is configured to:
      receive signaling indicative of performance of a reset operation involving at least one physical function among the plurality of physical functions;
      initiate a first timer that corresponds to an amount of time available for at least the one physical function among the plurality of physical functions to complete execution of pending commands;
      initiate a second timer that corresponds to an amount of time available for at least one additional physical function among the plurality of physical functions to complete execution of pending commands;
      initiate a third timer that corresponds to an amount of time available for at least the one additional physical function to join a recovery operation that is instigated as a result of performance of the reset operation; and
      control, upon completion of the third timer, performance of the recovery operation involving at least the one physical function among the plurality of physical functions and at least the one additional physical function among the plurality of physical functions.

8. The apparatus of claim 7, wherein the signaling indicative of performance of the reset operation involving at least the one physical function among the plurality of physical functions is generated in response to a determination that an input/output path coupled to the controller has experienced a failure.

9. The apparatus of claim 7, wherein the controller is configured to, in response to completion of the first timer, suspend data transfer across input/output paths corresponding to each physical function among the plurality of physical functions.

10. The apparatus of claim 9, wherein the controller is further configured to route data transfers across the input/output paths corresponding to each physical function among the plurality of physical functions to firmware associated with the controller.

11. The apparatus of claim 9, wherein the controller is configured to reset backend circuitry associated therewith and reset frontend circuitry associated therewith subsequent to suspension of the data transfer across the input/output paths corresponding to each physical function among the plurality of physical functions.

12. The apparatus of claim 7, wherein the controller is configured to reset a non-volatile memory express (NVMe) interface associated therewith as part of performance of the recovery operation.

13. The apparatus of claim 12, wherein the controller is configured to reset the non-volatile memory express (NVMe) interface associated therewith without resetting a peripheral component interconnect express (PCIe) interface associated with the controller.

14. The apparatus of claim 12, wherein the controller is further configured to reset a command table associated therewith in response to resetting the NVMe interface associated with the controller as part of performance of the recovery operation.

15. The apparatus of claim 7, wherein a total sum of amounts of time allotted to the first timer, the second timer, and the third timer is less than an amount of time associated with a timeout value of a host coupled to the controller or the memory device, or both.

16. The apparatus of claim 7, wherein the first timer corresponds to an amount of time required by a peripheral component interconnect express interface to complete execution of the pending commands associated with the one physical function.

17. An apparatus, comprising:
   a memory controller that includes:
      a front end portion;
      a back end portion;
      a first physical function; and
      a second physical function, wherein the memory controller is configured to:
         receive signaling indicative of performance of a reset operation involving the first physical function;
         initiate a first timer that corresponds to an amount of time available for the first physical function to complete execution of pending commands;

initiate a second timer that corresponds to an amount of time available for the second physical function to complete execution of pending commands;

initiate a third timer that corresponds to an amount of time available for the second physical function to join a recovery operation that is instigated as a result of performance of the reset operation, wherein:

a total sum of amounts of time allotted to the first timer, the second timer, and the third timer is less than an amount of time associated with a timeout value of a host coupled to the memory controller; and control, upon completion of the third timer, performance of the recovery operation involving the first physical function and the second physical function.

18. The apparatus of claim 17, wherein the memory controller further includes a third physical function, and wherein the memory controller is further configured to:

determine, during the amount of time available for the second physical function to join the recovery operation that is instigated as the result of performance of the reset operation, that the third physical function is to join the recovery operation; and control, upon completion of the third timer, performance of the recovery operation involving the first physical function, the second physical function, and the third physical function.

19. The apparatus of claim 17, wherein the memory controller is configured to reset a non-volatile memory express (NVMe) interface associated therewith without resetting a peripheral component interconnect express (PCIe) interface associated with the memory controller.

20. The apparatus of claim 19, wherein the memory controller is further configured to reset a command table associated therewith in response to resetting the NVMe interface associated with the memory controller as part of performance of the recovery operation.

21. The apparatus of claim 17, wherein the memory controller is configured to:

in response to completion of the first timer, suspend data transfer across input/output paths corresponding to the first physical function and the second physical function; and reset backend circuitry associated therewith and reset frontend circuitry associated with the memory controller subsequent to suspension of the data transfer across the input/output paths corresponding to the first physical function and the second physical function.

22. The apparatus of claim 17, wherein the signaling indicative of performance of the reset operation involving the first physical function is generated in response to a determination that an input/output path coupled to the memory controller has experienced a failure.

23. The apparatus of claim 17, wherein the memory controller is configured to:

suspend data transfer across input/output paths corresponding to the first physical function and the second physical function in response to completion of the first timer; and route data transfers across the input/output paths corresponding to the first physical function and the second physical function to firmware associated with the memory controller.

* * * * *